United States Patent
Hein et al.

(10) Patent No.: US 8,692,557 B2
(45) Date of Patent: Apr. 8, 2014

(54) GROUND MONITOR

(71) Applicant: Lear Corporation, Southfield, MI (US)

(72) Inventors: David A. Hein, Sterling Heights, MI (US); Aftab Ali Khan, Dearborn, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 13/921,234

(22) Filed: Jun. 19, 2013

(65) Prior Publication Data

US 2013/0278271 A1    Oct. 24, 2013

(51) Int. Cl.
G01R 31/00    (2006.01)
G01R 19/145   (2006.01)

(52) U.S. Cl.
CPC .................................. G01R 19/145 (2013.01)
USPC ......................................................... 324/505

(58) Field of Classification Search
None
See application file for complete search history.

(56) References Cited

U.S. PATENT DOCUMENTS

| | | |
|---|---|---|
| 3,810,003 A | 5/1974 | Portoulas |
| 3,952,224 A | 4/1976 | Evans, Jr. |
| 4,857,826 A | 8/1989 | Graham |
| 5,525,908 A * | 6/1996 | Brownell .................... 324/508 |
| 5,754,114 A | 5/1998 | Gnadt |
| 6,016,058 A | 1/2000 | Sussman et al. |
| 6,072,317 A | 6/2000 | MacKenzie |
| 6,590,188 B2 | 7/2003 | Cline et al. |
| 2007/0153560 A1 | 7/2007 | Zhang et al. |
| 2009/0086462 A1 | 4/2009 | Funato et al. |
| 2009/0160663 A1 | 6/2009 | Silverman et al. |

FOREIGN PATENT DOCUMENTS

| | | |
|---|---|---|
| CN | 1531162 A | 9/2004 |
| CN | 101666851 A | 3/2010 |
| DE | 3429067 A1 | 2/1986 |
| DE | 10207856 A1 | 12/2003 |
| WO | 2010023527 A2 | 3/2010 |

OTHER PUBLICATIONS

German Patent Office, German Office Action for corresponding Application No. 10 2011 076 320.1 mailed Dec. 22, 2011, 10 pages.

* cited by examiner

*Primary Examiner* — Paresh Patel
(74) *Attorney, Agent, or Firm* — Brooks Kushman P.C.

(57) ABSTRACT

A ground monitor is disclosed. The ground monitor may be configured to conduct a ground continuity test based on a determined ground resistance. The ground monitor may be operable to determine the ground resistance as a function of a voltage differential detected during application of a test current.

7 Claims, 4 Drawing Sheets

GROUND MONITOR

CROSS-REFERENCE TO RELATED APPLICATION

This application is a division of U.S. application Ser. No. 12/793,008 filed Jun. 3, 2010, the disclosure of which is incorporated in its entirety by reference herein.

TECHNICAL FIELD

The present invention relates to ground monitors operable to assess a ground resistance of a network, such as but not limited those suitable for use in assessing a ground resistance of a single-phase, AC domestic/commercial power network.

BACKGROUND

A ground continuity test may be performed on three-wire, AC power networks to test a quality of a ground provided by a ground wire or plane as a function of a measured ground resistance of the network. The ground quality of the ground and/or the likelihood that the ground is proper may be determined by comparing the measured ground resistance to a predefined threshold. A ground continuity tester or ground monitor may be used to conduct the measurement/assessment. It can be problematic for such devices, however, to accurately measure the ground resistance due to noise and other interferences caused by electrical devices connected to the measured power network.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
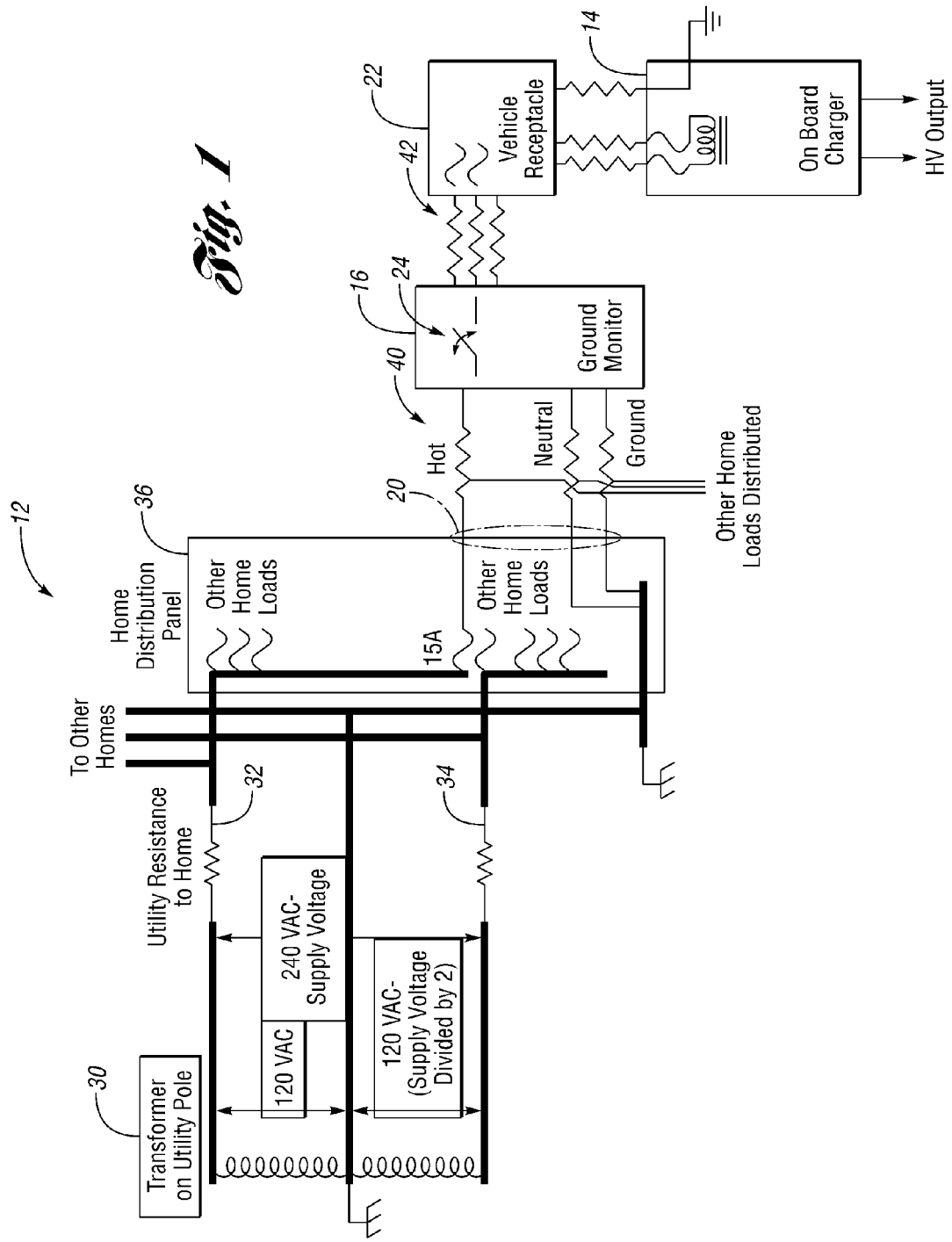
FIG. 1 illustrates a charging system in accordance with one non-limiting aspect of the present invention.

FIG. 1 illustrates a charging system 10 in accordance with one non-limiting aspect of the present invention. The system 10 illustrates the use of a domestic power network 12 to deliver energy to an onboard vehicle charger 14 that the vehicle charger can then use to charge a vehicle (not shown), such as by charging a vehicle battery (not shown) or other energy storage devices (e.g., capacitor). A ground monitor 16, interconnected between the onboard charger 14 and a wall outlet 20 of the domestic power network, is configured in accordance with one non-limiting aspect of the presenting invention to facilitate safely delivering energy from the wall outlet 20 to an electrical connection receptacle 22 included within the vehicle.

The ground monitor 16 may be configured to measure ground continuity of the wall outlet 20 and to permit or prevent a transfer of energy between the wall outlet 20 and the vehicle according to the ground continuity measurement, such as by controlling opening and closing of a relay 24. The ground monitor 16 is shown to include the relay 24 to demonstrate one type of control that may be implemented to prevent vehicle charging in the event of an unacceptable ground continuity measurement. The ground monitor 16 may omit the relay in favor of simply issuing a command or other information to a vehicle system controller or other element regarding the ground continuity measurement such that the information receiving element may then perform any number of other operations to prevent vehicle charging or to otherwise prevent transfer of energy to the vehicle.

The domestic power network 12 contemplated to facilitate charging of the vehicle is described for exemplary purposes to be a standard three-wire, single-phase AC network where a transform pole 30 converts three-phase, AC into single-phase AC. The single-phase AC may be provided at 120V and phase-shifted by 180° prior to transmission over first and second wires 32, 34 connected to at least one home distribution panel 36. The home distribution panel 36, optionally by way of fuses or other switches, may in turn deliver the AC over a home network (not shown) to a number of other home loads, which may be connected to a corresponding number of additional wall outlets. For exemplary purposes, only the ground monitor 16 is shown to be connected to the one wall outlet 20, however, it is well understood that any number of other devices may be connected within the home and to other homes.

The components (relay, etc.) comprising the ground monitor 16 may be included within a housing configured to facilitate electrical connections to the wall outlet 20 and the receptacle 22 included on the vehicle. A first and second extension cord 40, 42 may be included respectively on the input and output sides of the ground monitor to facilitate this electrical connection. The extension cords 40, 42 each include a three-pronged terminal (male or female) to facilitate connecting to the wall outlet 20 and the vehicle receptacle 22. The extension cords 40, 42 may be of varying length, and optionally, the first extension cord 40 may have a very short length, essentially the length of the three-pronged terminal, in the event the housing is mounted directly to a wall of the home or otherwise directly plugged into to the wall outlet 20, e.g. such as if the housing rests against the wall and includes integrated hot, neutral, and ground projections.

Figure 2:
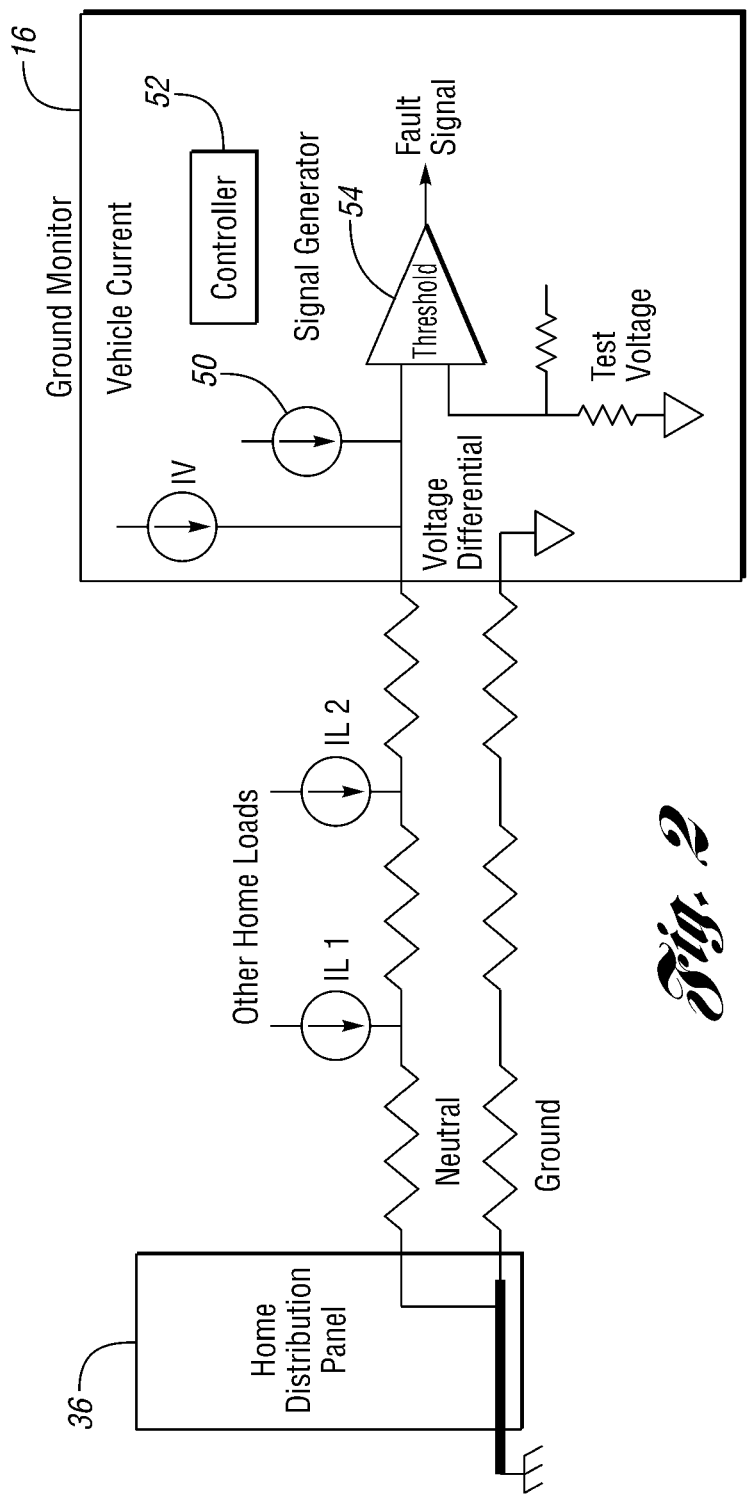
FIG. 2 schematically illustrates operation of the ground monitor in accordance with one non-limiting aspect of the present invention.

FIG. 2 schematically illustrates operation of the ground monitor 16 in accordance with one non-limiting aspect of the present invention. The ground monitor assesses ground continuity according to a calculated ground resistance. The ground resistance is measured according to a voltage differential measured between at least two of the wall outlet terminals, which are shown for exemplary purposes to be those associated with the ground and neutral plugs. The ground resistance is determined according to the following formula:

Ground resistance=Test Current/Voltage Differential

The test current is applied with a signal generator 50 to the neutral plug. The voltage differential measured in response to the test signal is a function of the test current the resistance of the wiring comprising the current path between the neutral plug and the ground plug, which may vary depending on length, age, loads, etc. The resulting voltage differential, however, may be greater than that which would be produced by the test current on its own due to current contributions from the vehicle (IV) and other loads (IL1 IL2) connected to the domestic power network. These current contributions are generally the result of noise and other interferences added to the current path from other electrical devices. In order to assess the ground resistance as accurately as possible, the influence of the currents added to the test current should be limited as much as possible.

It can be difficult to limit the influence of the additional currents (noise) on the voltage differential measurement since the noise induced by each device can vary depending on the operating conditions of the device and any number of other inconsistent events. The ground monitor 16 of the present invention includes a controller 52 operable to facilitate controlling the signal generator 50 so that the voltage differential generated by the test current is achieved in a manner deemed to provide the most reliable indication of the ground resistance, i.e., one that results in the voltage differential having the least amount of noise influence. This may include the controller 52 being operable in an assessment quality mode where the controller iteratively applies different test currents until the test current deemed to provide the most reliable result is identified.

The assessment quality mode, for example, may include the controller selecting one or more characteristics of multiple test currents to be applied as part of a process for identifying the most reliable result. While not exclusive to the variable characteristics, one non-limiting aspect of the present invention contemplates the controller 52 varying a frequency, amplitude, and/or timing of test current application when identifying the more reliable characteristics for the test current. Once the most reliable characteristics are identified, the controller 52 may then selectively and/or continuously apply the test current in order to test ground continuity.

Optionally, the controller 52 may be configured to vary at least two of the characteristics when identifying the most reliable set of characteristics in order to confirm the influence of one varied characteristics relative to another. By varying at least frequency or timing with amplitudes variations, the controller 52 is able to assess which conditions result in the least amount of noise being present in the voltage differential measurements. The controller 52 can achieve this by comparing how well the voltage differential measurement correlated with an amplitude variation for a giving frequency or timing.

The voltage differential should change in proportion to the change in test current amplitude. For example, if the test current doubled, the voltage differential should double. The most closely correlated set of test current characteristics, therefore, corresponds with the set that most closely correlates with the with the amplitude variation, i.e., the set of characteristics that most closely results in a doubling of the voltage differential. The controller 52 can iteratively change the frequency or timing with the amplitude variations to determine the most reliable set of test current characteristics. The noise in the power network may vary depending on the devices being operated at that time such that the set of test current characteristics deemed to be the most reliable over time may change. The controller 52 may be configured to adjust the test current characteristics as needed and/or it my be configured to re-evaluate the characteristics upon occurrence of a particular event, such as based on changes in the ground resistance, number of charging cycles, etc.

The ground monitor 16 may be configured to open the relay 24 (or to take some other operation depending on the configuration of the ground monitor) in the event the ground continuity is inappropriate. The ground continuity may be deemed inappropriate when the ground resistance calculated is greater than a predetermined threshold. A threshold sensor 54 may be configured to output a fault signal to indicate to the controller 52 whether the ground resistance has surpassed the threshold. The controller 52 may be operable to program the threshold as a single value limit and/or a range of limits. The controller 52 may also be operable to change the threshold as necessary, such as to support changes in testing standards, different power networks, etc.

Before opening the relay 24 or otherwise indicating a failure in a manner that results in preventing use of energy from the wall outlet 20, the controller 52 may require certain other conditions to occur at the same time. For example, the controller 52 may require receipt of the fault signal to occur while the test current was applied with the most reliable set of test current characteristics. The controller 52 may log or otherwise track conditions resulting in ground resistance faults. To insure faults are caused by noise or true ground faults, the controller 52 may be configured to limit the test currents applied by the signal generator 50 to current levels below those that would trigger a ground fault interrupter included within the wall outlet 20.

Figure 3:
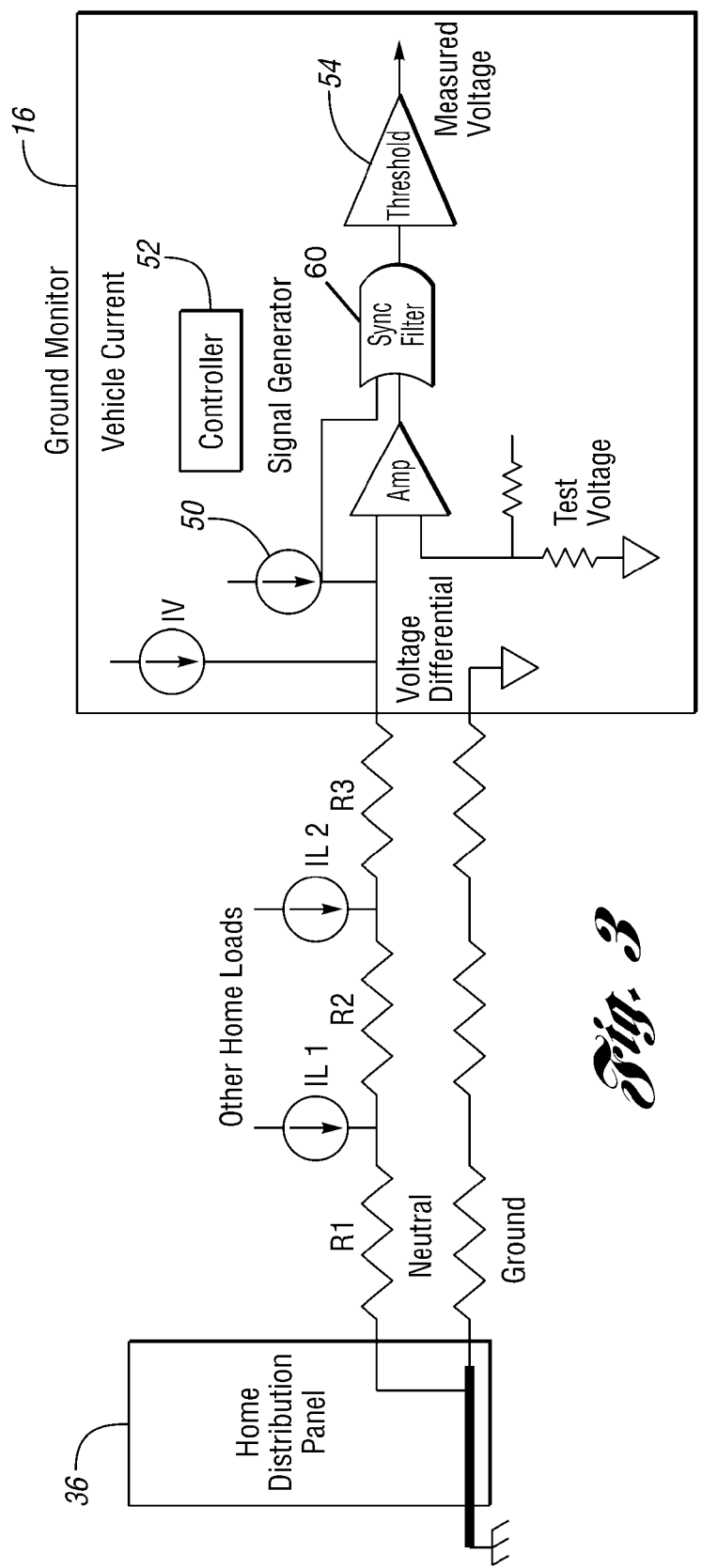
FIG. 3 illustrates a filter-based approach for testing ground continuity in accordance with one non-limiting aspect of the present invention.

FIG. 3 illustrates a filter-based approach for testing ground continuity in accordance with one non-limiting aspect of the present invention. The ground monitor 16, when configured to facilitate the filtered-based approach, includes a filter 60 configured to filter the voltage differential measurement. The filter 60 operates according to a frequency of the test signal such that a filter signal output from the filter 60 eliminates voltage measurements at currents other than those which correspond to a filtered frequency, i.e., a frequency selected by the controller 52 when attempting to identify the frequency as one of the test current characteristics. The controller 52 may be operable to select the filtered frequency to be different than a frequency used by the other loads within the home, i.e., 60 Hz.

Figure 4:
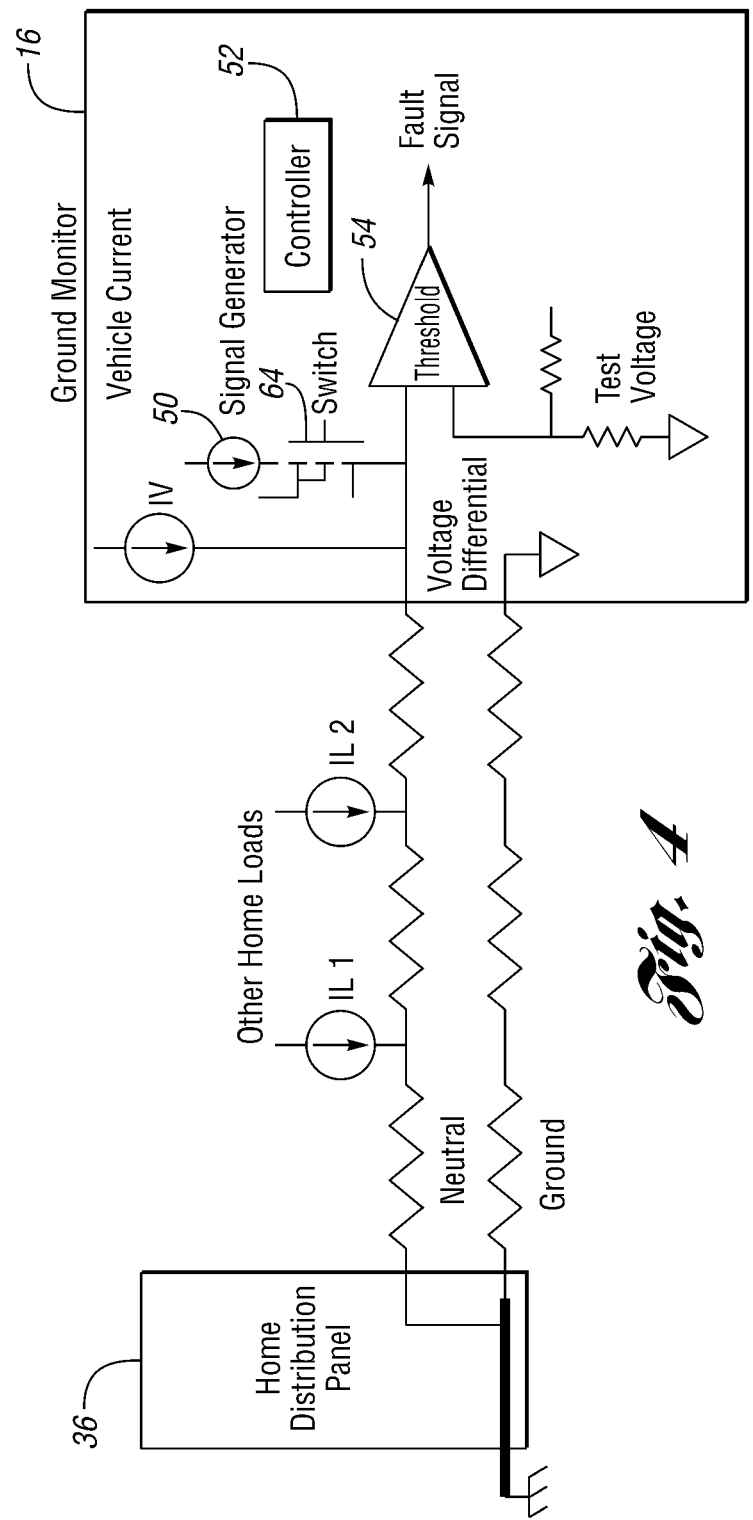
FIG. 4 illustrates a timing-based approach for testing ground continuity in accordance with one non-limiting aspect of the present invention.

FIG. 4 illustrates a timing-based approach for testing ground continuity in accordance with one non-limiting aspect of the present invention. The ground monitor 16, when configured to facilitate the timing-based approach, includes a switch 64 to controlling a timing at which the test current is introduced to the neutral plug. The controller 52 may control the switch 64 so that the test current is applied to the neutral plug within a predefine range defined relative to the zero-crossing set by the frequency of the current being carried over the hot plug. The controller 52 may be operable to measure and/or to select the zero-crossing timing (amount of time before, during, or after the true zero-crossing) to be that which results in the amplitude variation that results in the closest correlated voltage variation.

As supported above, one non-limiting aspect of the present invention contemplates a control circuit and algorithm that allows the detection of the integrity of the safety ground connection for electric vehicle charging. This circuit may place a test current through the neutral to ground wire loop for standard 110 AC Voltage Grounded Neutral applications. This test current may be placed in a manner that it can be easily distinguished from other noise sources that are present on the AC Neutral line.

One non-limiting aspect of the present invention may include placing a continuous AC test current into the neutral to ground loop that is offset from the 60 or 50 Hz Frequency of the typical 110V Power supply. The response to the test current may be synchronously filtered and amplified to detect the low level signal over the high level of noise. This process can continuously monitor the quality of the ground connection.

One non-limiting aspect of the present invention may include placing an impulse test current into the neutral to ground loop that is synchronized to a low noise portion of the Power supply voltage. The response to the test current may be monitored by a micro controller to test before, during and after the test pulse to determine quality of the ground connection.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention. The features of various implementing embodiments may be combined to form further embodiments of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A ground monitor being operably coupled to a three-pronged outlet having a hot plug, a neutral plug, and a ground plug of an AC power network to detect a ground resistance of the network based on a voltage differential between the neutral plug and the ground plug of the outlet, the ground monitor comprising:

a signal generator operable to apply a test current to the neutral plug at a first frequency, wherein the hot plug of the outlet receives a current flowing therethrough at a second frequency and the first frequency is different from the second frequency;

a filter being operable to remove signals having the second frequency and to output a filtered signal; and a voltage sensor operable to measure a voltage differential between the neutral and ground plugs based on the filtered signal, the voltage differential representing the ground resistance during application of the test current.

2. The ground monitor of claim 1 further comprising a frequency sensor operable to sense the second frequency of the current flowing to the hot plug and a controller operable with the frequency sensor to select the first frequency of the test current to be different from the second frequency.

3. The ground monitor of claim 2 wherein the controller is further operable in a frequency test mode during which the test current is applied at a plurality of frequencies and to select the first frequency to be the one of the plurality of frequencies resulting in a highest quality measurement of the voltage differential.

4. The ground monitor of claim 3 wherein the controller, during the frequency test mode, being further operable to also vary an amplitude of the test current for each of the plurality of frequencies, the controller being further operable to detect the varying amplitudes of the test current when determining the highest quality measurement.

5. The ground monitor of claim 4 wherein the controller being further operable to determine the voltage variation induced at each of the varying amplitudes and selecting the highest quality measurement to correspond with the one of the plurality of frequencies where the voltage variations substantially correlates with the varying amplitudes.

6. The ground monitor of claim 1 wherein the signal generator continuously applies the test current while the terminals are connected to the neutral and ground plugs.

7. The ground monitor of claim 1 wherein the signal generator applies the test current in moments in which the current flowing through the hot plug is at a zero-crossing.

* * * * *

UNITED STATES PATENT AND TRADEMARK OFFICE
CERTIFICATE OF CORRECTION

| | | |
|---|---|---|
| PATENT NO. | : 8,692,557 B2 | Page 1 of 1 |
| APPLICATION NO. | : 13/921234 | |
| DATED | : April 8, 2014 | |
| INVENTOR(S) | : David A. Hein et al. | |

It is certified that error appears in the above-identified patent and that said Letters Patent is hereby corrected as shown below:

On the Title Page:

Item (22)    After:
Filed:  June 19, 2013

Insert -- Related U.S. Application Data

(62) Division of application 12/793,008, filed on June 3, 2010 --.

Signed and Sealed this
Eighth Day of July, 2014

Michelle K. Lee
*Deputy Director of the United States Patent and Trademark Office*